United States Patent [19]
Richard et al.

[11] Patent Number: 5,998,999
[45] Date of Patent: Dec. 7, 1999

[54] VOLUME RF COILS WITH INTEGRATED HIGH RESOLUTION FOCUS COILS FOR MAGNETIC RESONANCE IMAGING

[75] Inventors: Mark A. Richard, South Euclid; Theodore J. Reisker, Willoughby Hills, both of Ohio

[73] Assignee: Picker International, Inc., Highland Heights, Ohio

[21] Appl. No.: 08/989,487

[22] Filed: Dec. 12, 1997

Related U.S. Application Data

[60] Provisional application No. 60/033,065, Dec. 12, 1996.

[51] Int. Cl.$^6$ .................................................. G01V 3/00
[52] U.S. Cl. .......................................... 324/318; 600/421
[58] Field of Search .................................. 324/318, 322, 324/314, 307, 309; 600/421, 422

[56] References Cited

U.S. PATENT DOCUMENTS

| | | | |
|---|---|---|---|
| 4,638,253 | 1/1987 | Jaskolski et al. | 324/318 |
| 4,692,705 | 9/1987 | Hayes et al. | 324/322 |
| 4,820,987 | 4/1989 | Mens et al. | 324/318 |
| 4,825,162 | 4/1989 | Roemer et al. | 324/318 |
| 4,885,541 | 12/1989 | Hayes | 324/318 |
| 4,887,039 | 12/1989 | Roemer et al. | 324/322 |
| 5,138,260 | 8/1992 | Molyneaux et al. | 324/309 |
| 5,309,104 | 5/1994 | Frederick et al. | 324/318 |
| 5,365,173 | 11/1994 | Zou et al. | 324/318 |
| 5,510,711 | 4/1996 | Molyneaux et al. | 324/309 |
| 5,510,714 | 4/1996 | Takhasi et al. | 324/318 |
| 5,515,855 | 5/1996 | Meyer et al. | 128/653.5 |
| 5,543,711 | 8/1996 | Srinivasan et al. | 324/318 |

OTHER PUBLICATIONS

D. Ballon, M.C. Graham, S. Miodownik and J.A. Koutcher, "A 64 MHz Half–Birdcage Resonator for Clinical Imaging," Journal of Magnetic Resonance, 90, 1990, pp. 131–140.

K. Meyer and D. Ballon, "A 3×3 Mesh Two–Dimensional Ladder Network Resonator for MRI of the Human Head," Journal of Magnetic Resonance, 107, 1995, pp. 19–24.

*Primary Examiner*—Louis Arana
*Attorney, Agent, or Firm*—Fay, Sharpe, Fagan, Minnich & McKee, LLP

[57] ABSTRACT

A magnetic resonance imaging apparatus includes a main magnet (12) for generating a main magnetic field in an examination region (14) and a radio frequency coil assembly. The radio frequency coil assembly transmits radio frequency pulses into the examination region (14) to induce magnetic resonance in selected dipoles disposed therein. The radio frequency coil assembly also receives signals from selected resonating dipoles. The radio frequency coil assembly includes a birdcage coil (60) having a plurality of conductive elements (64) constructed on a dielectric form positioned about the examination region (14). The birdcage coil (60) includes a plurality of capacitors (C1–C24) and corresponding plurality of series connected diode inductor pairs connected in parallel with each capacitor to form resonant trap circuits. The radio frequency coil assembly also includes at least one focus coil (62a–c) having a conductive loop placed on a thin dielectric layer attached to the birdcage coil (60) such that the focus coil (62a–c) is electrically insulated from the birdcage coil (60). The focus coil includes a plurality of capacitors connected in series and corresponding plurality of series connected diode inductor pairs connected in parallel with each capacitor.

20 Claims, 5 Drawing Sheets

PORT 1 AND PORT 2 QUADRATURE COMBINED.
OUTPUT TO SYSTEM.

VOLUME RF COILS WITH INTEGRATED HIGH RESOLUTION FOCUS COILS FOR MAGNETIC RESONANCE IMAGING

This application claims the benefit of U.S. Provisional Application No. 60/033,065, filed Dec. 12, 1996.

BACKGROUND OF THE INVENTION

The present invention relates to the magnetic resonance arts. It finds particular application in conjunction with medical magnetic resonance imaging systems and be described with particular reference thereto. It is to be appreciated, however, that the present invention may also find application in conjunction with other types of magnetic resonance imaging systems, magnetic resonance spectroscopy systems, and the like.

In magnetic resonance imaging, a substantially uniform main magnetic field is generated within an examination region. The main magnetic field polarizes the nuclear spin system of a subject being imaged within the examination region. Magnetic resonance is excited in dipoles which align with the main magnetic field by transmitting radio frequency excitation signals into the examination region. Specifically, radio frequency pulses transmitted via a radio frequency coil assembly tip the dipoles out of alignment with the main magnetic field and cause a macroscopic magnetic moment vector to precess around an axis parallel to the main magnetic field. The precessing magnetic moment, in turn, generates a corresponding radio frequency magnetic resonance signal as it relaxes and returns to its former state of alignment with the main magnetic field. The radio frequency magnetic resonance signal is received by the radio frequency coil assembly, and from received signals, an image representation is reconstructed for display on a human viewable display.

In certain MRI applications, it is advantageous to perform imaging scans with both a large field of view and a small field of view, high resolution scan. In the past, two separate radio frequency coils were employed, one to image the broad, general large field of view, and a separate radio frequency coil to image the narrower, more specific region of the subject being examined. For example, conventionally, when imaging the head, a quadrature birdcage coil is employed. The birdcage coil gives good uniformity and signal to noise ratio over the entire head. However, when performing imaging techniques such as functional neural imaging, it is advantageous to have very high resolution and signal-to-noise ratios in certain areas of the brain. The birdcage coil is not sufficient for such imaging techniques. Various other volume coils, such as dome top and derivatives of domes have been used. Nevertheless, to get the very high local signal-to-noise ratios, smaller diameter surface radio frequency coils are desirable. That being the case, the traditional way of performing such imaging was to use a whole head radio frequency coil to do the initial imaging. After localizing a specific region of interest within the broader field of view, the whole head radio frequency coil was removed and smaller diameter radio frequency surface coils or coil arrays were installed for imaging the specific region of interest. Likewise, when performing cardiac imaging, a whole-body quadrature birdcage coil was typically employed. This coil provided good uniformity over the entire torso allowing visualization of the heart, coronary arteries and associated vasculature. Alternately, whole-body wraparound coils have been employed. These coils sacrifice uniformity for improved signal-to-noise ratios. However, neither coil is sufficient when more detailed imaging of the arteries and/or other anatomy is desired. Again, detailed imaging of narrow, specific regions of interest was best accomplished by separate radio frequency surface coils. After imaging the broad, general field of view to locate the specific regions of interest, the radio frequency coils were changed to allow for more detailed imaging in the regions of interest.

A second previous method of performing such imaging was to use a large array of many smaller surface coils. When done in this manner, local surface anatomy was imaged well. However, anatomy at the center of the subject being examined had very low signal-to-noise ratios. Therefore, whole scans had extremely poor uniformity.

An inherent drawback of these prior techniques is that the changing of coils often lead to misalignment. Further, often associated with the changing of coils was the removal of the subject from the examination region, which, again, lead to misalignment problems upon the patient's return to the examination region. As well, for interventional MRI applications, it is advantageous to limit patient motion.

The present invention contemplates a new and improved magnetic resonance imaging apparatus which overcomes the above referenced disadvantages and others.

SUMMARY OF THE INVENTION

In accordance with one aspect of the present invention, a magnetic resonance imaging apparatus is provided. The magnetic resonance imaging apparatus includes a main magnet for generating a main magnetic field within an examination region. Also included is a radio frequency coil assembly for transmitting radio frequency pulses into the examination region to induce magnetic resonance in the selected dipoles disposed therein and for receiving signals from selected resonating dipoles disposed therein. The radio frequency coil assembly includes a birdcage coil and at least one focus coil attached to the birdcage coil such that the focus coil is electrically insulated from the birdcage coil. The birdcage coil has a plurality of conductive elements constructed on a dielectric form positioned about the examination region. Further, the birdcage coil includes a plurality of capacitors and corresponding plurality of diode inductor pairs connected with each capacitor to form resonant trap circuits. When an electrical DC bias current is applied to the birdcage coil, a parallel resonant circuit is formed at each capacitor which presents high impedance to electrical current flowing on end rings which effectively isolates adjacent conductive elements of the birdcage from one another. The focus coil has a conductive loop placed on a thin dielectric layer and includes a plurality of capacitors connected in series. Connected with each capacitor of the focus coil is a corresponding plurality of diode inductor pairs. When an electrical DC bias current is applied to the focus coil, a parallel resonance circuit is formed.

In accordance with a more limited aspect of the present invention, the magnetic resonance imaging apparatus includes a birdcage coil wherein the number of conductive elements in the birdcage coil is a multiple of four.

In accordance with a more limited aspect of the present invention, the birdcage coil has two RF output ports and two terminals such that the two RF output ports are connected to a quadrature combiner and the electrical DC bias current is applied between the two terminals.

In accordance with a more limited aspect of the present invention, the birdcage coils is a half birdcage coil.

In accordance with a more limited aspect of the present invention, the magnetic resonance imaging apparatus includes a plurality of focus coils wherein the conductive loops of each focus coil are overlapped to achieve minimum mutual inductance and the plurality of focus coils function collectively as a phased array.

In accordance with a more limited aspect of the present invention, each focus coil is connected to a dedicated electrical DC bias and a dedicated receiver channel.

In accordance with a more limited aspect of the present invention, an output of each focus coil is routed through an associated preamplifier to its dedicated receiver channel.

In accordance with a more limited aspect of the present invention, each focus coil is connected to the birdcage coil by at least one of a capacitor, and inductor, and a varactor diode.

In accordance with another aspect of the present invention, a method of magnetic resonance imaging is provided. The method includes generating a substantially uniform main magnetic field within an examination region and applying magnetic gradients across the examination region. A radio frequency coil assembly is arranged relative to a subject within the examination region such that a volume coils is positioned for imaging a broad, general field of view of the subject and a plurality of focus coils attached to the volume coil are positioned for imaging narrow, specific regions of interest within the broad, general field of view. DC biasing currents are applied to the radio frequency coil assembly for alternately engaging and disengaging the volume coil and focus coils. Magnetic resonance of dipoles within the examination region is selectively excited and signals from the resonating dipoles are received. From the received signals, an image representation is reconstructed and displayed on a human viewable display.

In accordance with a more limited aspect of the present invention, the plurality of focus coils are arranged such that they overlap to minimize mutual inductance, and they are engaged such that they function collectively as a phased array.

In accordance with another aspect of the present invention, a radio frequency coil assembly is provided in a magnetic resonance imaging apparatus. The magnetic resonance imaging apparatus has a main magnet which generates a substantially uniform main magnetic field within an examination region. A gradient coil assembly for generating substantially linear magnetic gradients across the examination region is also included in the magnetic resonance imaging apparatus. The magnetic resonance imaging apparatus further includes a current supply for selectively supplying electrical current pulses to the gradient coil assembly. A radio frequency coil assembly is disposed about the examination region positioned to transmit radio frequency signals into the subject receiving region and receive radio frequency signals therefrom. A transmitter for supplying radio frequency signals to the radio frequency coil assembly is also provided along with a receiver for receiving radio frequency signals via the radio frequency coil assembly. The magnetic resonance imaging apparatus also includes a reconstruction processor for reconstructing an image representation from the signals received by the radio frequency receiver to display on a human viewable display. The radio frequency coil assembly includes a volume coil for imaging a broad, general field of view of a subject within the examination region and at least one focus coil for imaging a specific narrow region of interest of the subject within the broad, general field of view. The focus coil is attached to the volume coil such that it is electrically insulated therefrom, and each focus coil has a conductive loop on a thin dielectric layer with a plurality of capacitors connected in series spaced along the conductive loop. A plurality of diode inductor pairs is connected with each capacitor of the focus coil.

In accordance with a more limited aspect of the present invention, the volume coil is selected from the group consisting of birdcage coils, half-birdcage coils, saddle coils, solenoids, and dome-topped coils.

In accordance with a more limited aspect of the present invention, the radio frequency coil assembly includes a plurality of focus coils.

In accordance with a more limited aspect of the present invention, each focus coil is connected to the volume coil by at least one of a capacitor, an inductor and a varactor diode.

In accordance with a more limited aspect of the present invention, the conductive loops of each focus coil are overlapped to achieve minimum mutual inductance and function collectively as a phased array.

In accordance with a more limited aspect of the present invention, each focus coil is arranged on the volume coil such that when the volume coil is positioned relative to a subject being examined for imaging, the broad, general field of view the focus coils are in alignment with the narrow specific regions of interest.

In accordance with another aspect of the present invention, a radio frequency coil assembly for a magnetic resonance scanner includes a volume coil for imaging a broad general field of view of a subject within an examination region and at least one focus coil, for imaging a specific narrow region of interest of the subject within the broad general field of view. Each focus coil is attached to the volume coil such that it is electrically insulated therefrom. Each focus coil has a conductive loop on a thin dielectric layer.

In accordance with a more limited aspect of the present invention, one of a capacitor, an inductor, and a varactor diode connects each focus coil to the volume coil.

In accordance with a more limited aspect of the present invention, a plurality of DC biases are attached to the volume coil and each focus coil such that when appropriate biases are applied the volume coil and each focus coil is selectively engaged.

In accordance with a more limited aspect of the present invention, a plurality of focus coils are attached to the volume coil and arranged such that the conductive loops of each focus coil is overlapped to produce minimum mutual inductance therebetween.

One advantage of the present invention is that imaging may be done with a broad, general field of view followed subsequently by imaging of a narrow specific region of interest within the broader, general field of view without exchanging or changing radio frequency coils.

Another advantage of the present invention is that high signal-to-noise ratios and high resolution imaging may be accomplished for specific regions of interest without having to remove the volume radio frequency coil.

Another advantage of the present invention is reduced cost of the overall magnetic resonance imaging apparatus due to the reduced number of individual radio frequency coils required.

Another advantage of the present invention is that the patient or subject is not moved when switching from imaging the broad, general field of view to imaging a narrower specific region of interest.

Still further advantages the invention will become apparent to those of ordinary skill in the art upon reading and understanding the following detailed description of the preferred embodiments.

BRIEF DESCRIPTION OF THE DRAWINGS

The invention may take form in various parts and arrangements of parts. The drawings are only for purposes of illustrating a preferred embodiment and are not to be construed as limiting the invention.

DETAILED DESCRIPTION OF THE PREFERRED EMBODIMENT

Figure 1:
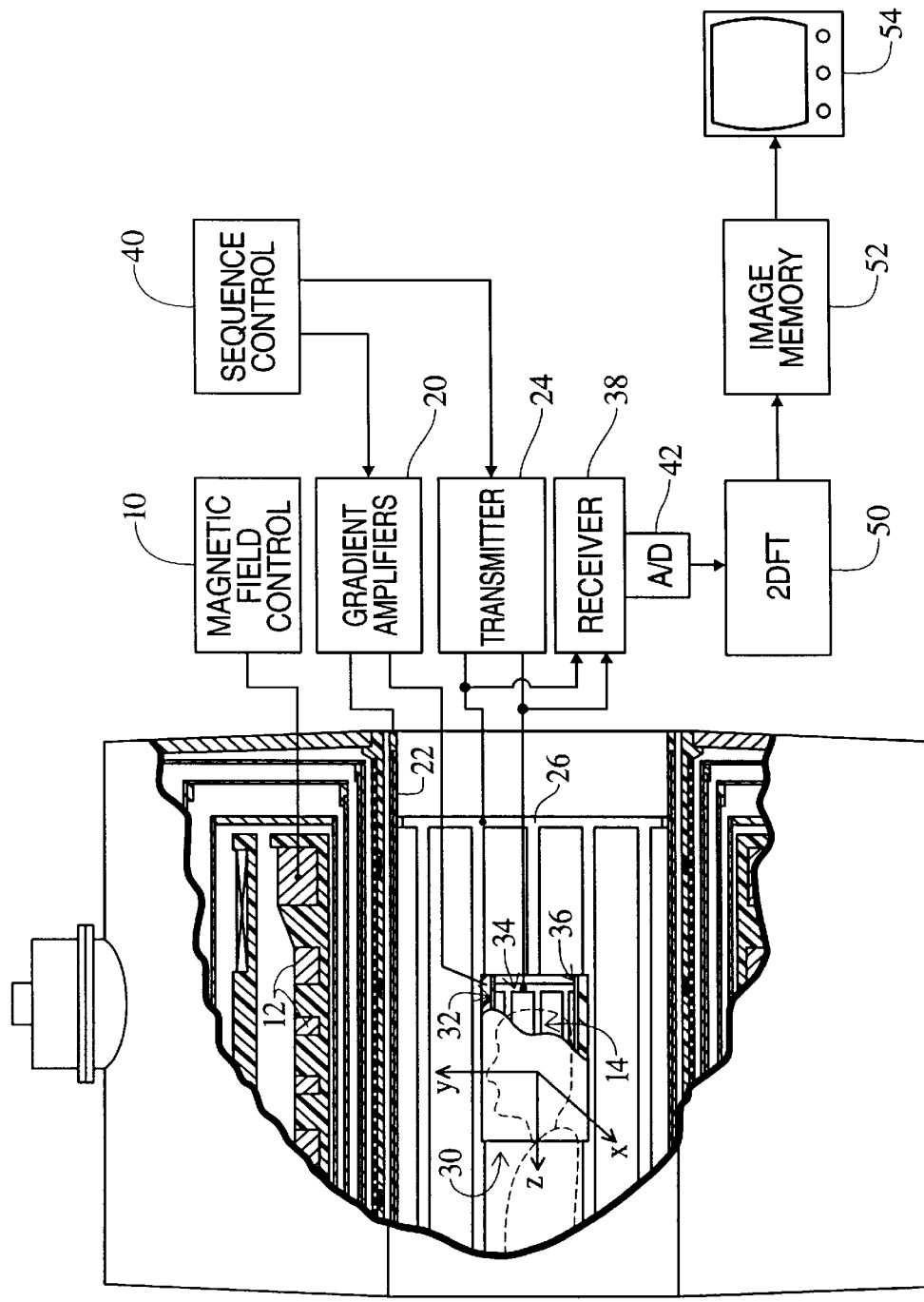
FIG. 1 is diagrammatic illustration of a magnetic resonance imaging apparatus with volume RF coils having integrated high resolution focus coils in accordance with aspects of the present invention.

With reference to FIG. 1, a main magnetic field control 10 controls superconducting or resistive magnets 12 such that a substantially uniform, temporally constant main magnetic field is created along a z axis through an examination region 14. A magnetic resonance echo means applies a series of radio frequency (RF) and magnetic field gradient pulses to invert or excite magnetic spins, induce magnetic resonance, refocus magnetic resonance, manipulate magnetic resonance, spatially and otherwise encode the magnetic resonance, to saturate spins, and the like to generate magnetic resonance imaging and spectroscopy sequences. More specifically, gradient pulse amplifiers 20 apply current pulses to selected ones or pairs of whole-body gradient coils 22 to create magnetic field gradients along x, y, and z axes of the examination region 14. A digital radio frequency transmitter 24 transmits radio frequency pulses or pulse packets to a whole-body RF coil 26 to transmit RF pulses into the examination region. A typical radio frequency pulse is composed of a packet of immediately contiguous pulse segments of short duration which taken together with each other and any applied gradients achieve a selected magnetic resonance manipulation. The RF pulses are used to saturate, excite resonance, invert magnetization, refocus resonance, or manipulate resonance in selected portions of the examination region. For whole-body applications, the resonance signals are commonly picked up by the whole-body RF coil 26.

For generating images of local regions of the subject, specialized radio frequency coils are placed contiguous to the selected region. For example, an insertable coil 30 is inserted surrounding a selected region at the isocenter of the bore. The insertable coil may include local gradient coils 32 which receive current pulses from the gradient amplifiers 20 to create magnetic field gradients along x, y, and z axes in the examination region within the coil 30. A radio frequency coil 34, part of the insertable coil 30, is used to excite magnetic resonance and receive magnetic resonance signals emanating from the patient in the region being examined. Alternatively, the radio frequency coil 34 can be used to only receive resonance signals introduced by body coil RF transmissions. An RF screen 36 blocks the RF signals coil from inducing any currents in the gradient coils and the surrounding structures. The resultant radio frequency signals are picked up by the whole-body RF coil 26, the RF coil 34, or other specialized RF coils and demodulated by a receiver 38, preferably a digital receiver.

A sequence control circuit 40 controls the gradient pulse amplifiers 20 and the transmitter 24 to generate any of a plurality of multiple echo sequences such as echo planar imaging, echo volume imaging, gradient and spin echo imaging, fast spin echo imaging, and the like. For the selected sequence, the receiver 38 receives a plurality of data lines in rapid succession following each RF excitation pulse. An analog-to-digital converter 42 converts each data line to a digital format. The analog-to-digital converter is disposed between the radio frequency receiving coil and the receiver for digital receivers and is disposed downstream (as illustrated) from the receiver for analog receivers. Ultimately, the radio frequency signals received are demodulated and reconstructed into an image representation by a reconstruction processor 50 which applies a two-dimensional Fouier transform or other appropriate reconstruction algorithm. The image may represent a planar slice through the patent, an array of parallel planar slices, a three-dimensional volume, or the like. The image is then stored in an image memory 52 where it may be accessed by a display, such as a video monitor 54 which provides a human readable display of the resultant image.

Figure 2A:
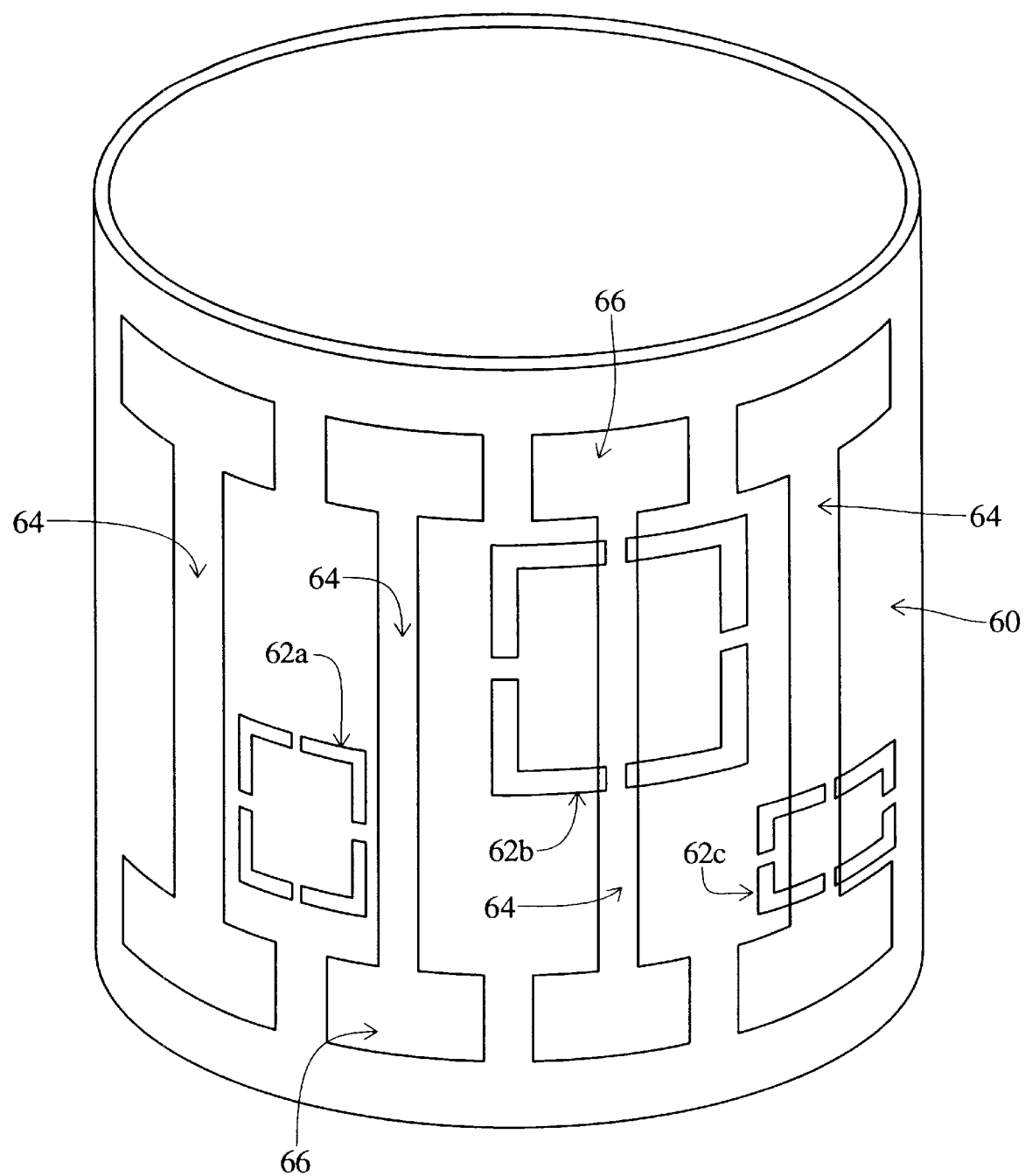
FIG. 2a is an illustration of a volume birdcage coil with attached focus coil loops showing the layout thereof in accordance with aspects of the present invention.
Figure 2B:
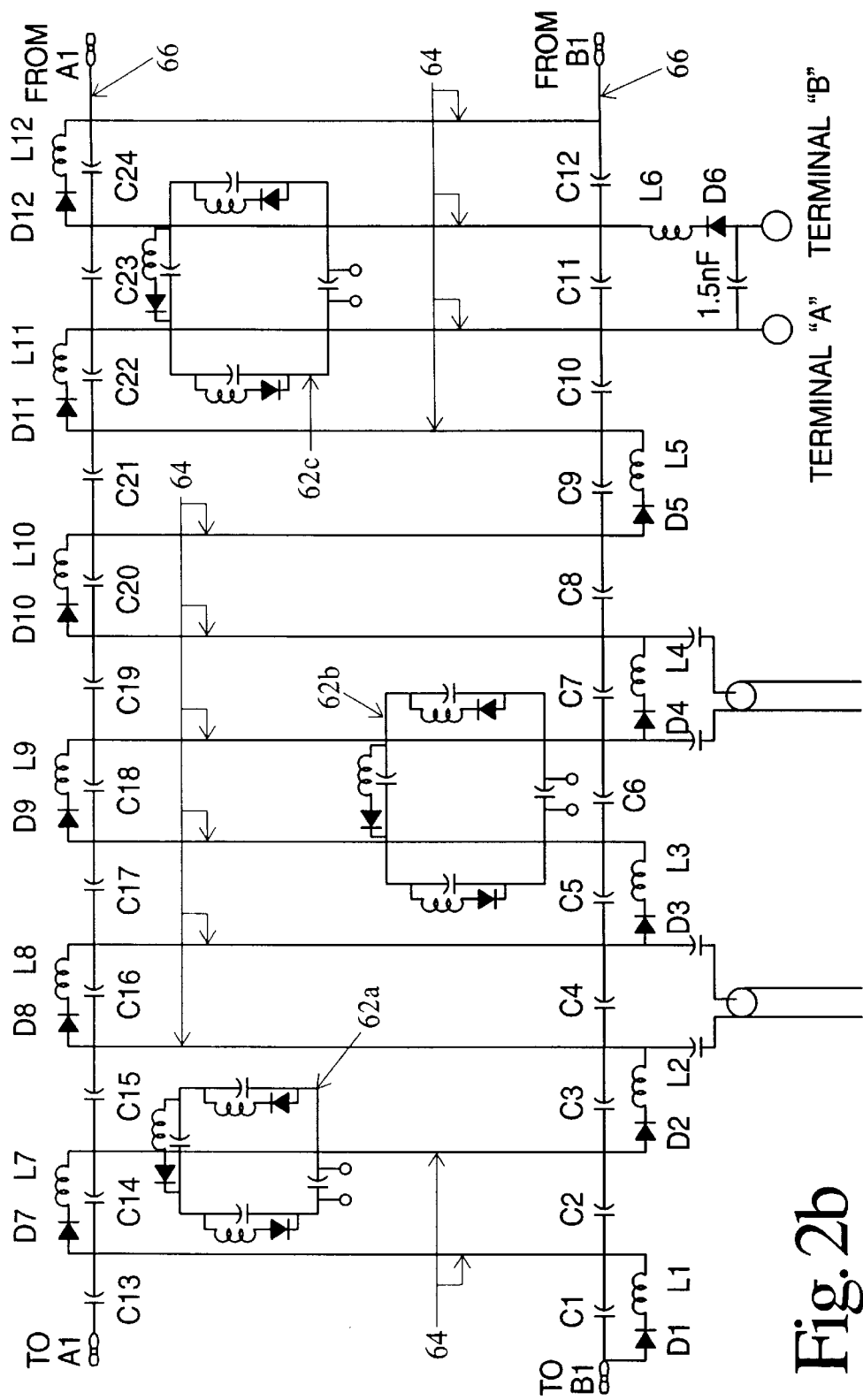
FIG. 2b is an illustration showing a schematic of the volume birdcage coil with attached focus coil loops in accordance with aspects of the present invention.

With reference to FIGS. 2a and b and continuing reference to FIG. 1, in one preferred embodiment, the radio frequency coil 34 is a head coil including a volume quadrature birdcage coil 60 and attached focus coil loops 62a–c. The high or low pass receive-only birdcage coil 60 is constructed on a dielectric form. FIG. 2a shows the conductor layout, and FIG. 2b shows the schematic. Although the figures show only a particular number of elements 64, it is recognized that 8, 12, 16, 20 or any other multiple of four may be employed. The birdcage 60 is provided with capacitors C1–C24 to resonate the birdcage to the desired frequency of operation. PIN diodes D1–D12 and inductors L1–L12 are connected in parallel with the capacitors to form resonant trap circuits. When a positive DC bias current is applied to terminal B with respect to terminal A, a parallel resonant circuit is formed at each capacitor. This presents a high impedance circuit to the current flowing on the end rings 66, thus effectively isolating each adjacent element 64 of the birdcage 60 from one another. For a 12 element head coil operating at 64 megahertz, the values of C1–C24 are approximately 120 pF while the values of L1–L12 are approximately 50 nH.

During excitation or transmit, the whole-body RF coil 26 is employed. A forward decoupling current applied to the head coil prevents coupling between the whole-body RF coil 26 and the head coil 34. The outputs of the birdcage coil 60, RF port 1 and RF port 2, are connected to a quadrature combiner (not illustrated). The combined output is cabled to a preamplifier and subsequently to a nuclear magnetic resonance receive channel (see FIG. 4). Although the birdcage 60 is shown as being capacitively fed, those skilled in the art will recognize that there are numerous ways to feed a birdcage coil, anyone of which may be employed. In particular, one may use capacitive feeding with baluns, a capacitive four-point feeding, inductive feeding, or employ a virtual ground.

A plurality focus coil loops 62a–c are attached to the birdcage coil 60. The focus coil loops 62a–c are each placed upon a thin, dielectric layer so that the coils are electrically insulated from the birdcage coil 60. These loops may be circular, square, or rectangular, and are sized substantially smaller than the diameter of the dielectric form on which the birdcage coil 60 is laid out. Typically, diameters are 280–260 millimeters for the birdcage coil form and 30–60 millimeters for the focus coil loops 62*a–c*. Each focus coil loop 62*a–c* is broken in four locations and series capacitors are connected as shown in the schematic of FIG. 2*b*. These focus coils are tuned to resonance at the desired frequency of operation by adjusting the value of the series capacitors. In addition, the coils have PIN diodes and inductors across each capacitor, such that when a DC bias current is applied to each coil, the diodes turn on and a parallel resonance circuit is formed. This parallel resonance circuit prevents the flow of RF current in the coil loops. The loops are each cabled to their own preamplifier, receiver channel, and DC bias channel (see FIG. 4). Again, although the focus coil loops are shown as being capacitively fed, other feeding methods are possible.

Although three focus coil loops are shown in FIGS. 2*a* and *b*, the number of coil loops employed will vary depending upon the intended application of the coil. For example, focus coil loops may be positioned over each eye for orbits imaging, around the ears for auditory canal imaging, and near each jaw for TMJ imaging. Additionally or alternatively, one may position loops near sections of the brain that are of interest in functional neural imaging.

When a whole-head volume scan is to be performed, the focus coil loops 62*a–c* are turned off by applying DC bias to the respective channels, thus preventing any RF current from flowing in the loops. When a high resolution, small field of view image from the area near a focus coil loop is desired, DC bias is applied to the volume birdcage coil 60, thus decoupling the birdcage 60. In addition, DC bias is applied to the respective channels of the other loops to decouple those loops which are unused. Data for the image is collected through the remaining channel. If a different area of the head is to be imaged, that channel can be decoupled by applying the appropriate DC bias thereto and different RF focus coil loops may be used. That is to say, the volume coil and the individual focus coils are selectively engaged by applying the appropriate DC bias to the respective channel depending on the region in which imaging is desired.

Figure 3:
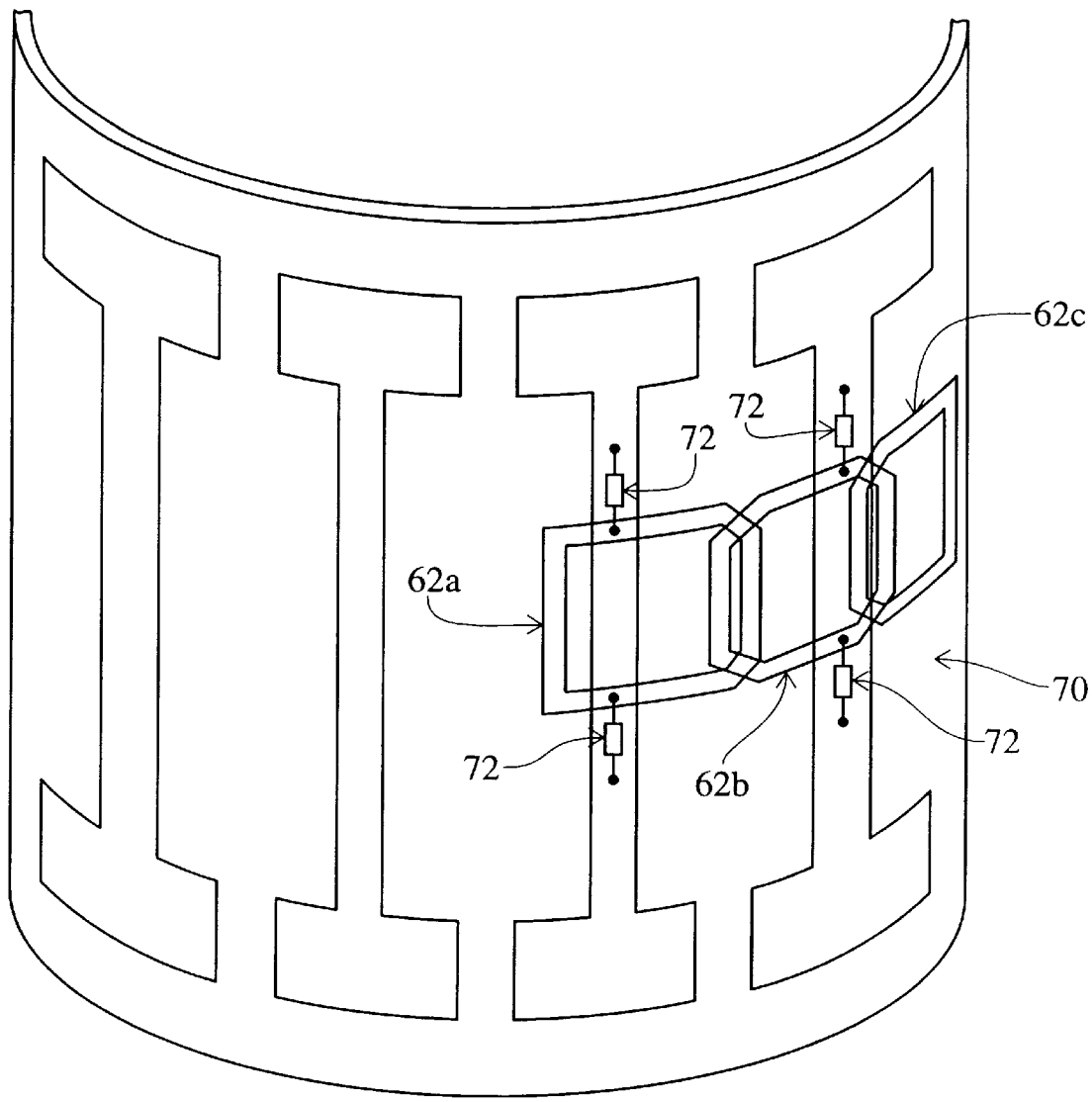
FIG. 3 is an illustration of a volume half-birdcage coil with overlapping attached focus coil loops in accordance with aspect of the present invention; and, FIG. 4 is a block diagram showing the wiring of the volume coil and the focus coils in accordance with aspects of the present invention.

In another preferred embodiment, the volume coil is a half birdcage cardiac coil 70. The half birdcage 70 is constructed on a rigid dielectric form. The layout is shown in FIG. 3. The half birdcage 70 is constructed such that it wraps around the chest of the patient. The half birdcage 70 may be modified with shoulder cutouts to fit beneath the arms of a patient. The half birdcage 70 provides sufficient coverage to visualize patient anatomy from the top of the neck to below the diaphragm. On a second, thin dielectric layer, a plurality of small focus coil loops 62*a–c* are constructed. The thin dielectric layer is positioned on the rigid dielectric form directly on top of the half birdcage coil 70. The thin dielectric layer electrically insulates the focus coil loops 62*a–c* from the birdcage coil 70. The loops are overlapped to give minimum mutual inductance between coils such that cross talk therebetween is minimized. The small focus coil loops 62*a–c* are located along the left side of the patient's anatomy and wrap around the patient. The focus coil loop sizes are typically between 10 cm and 15 cm and preferably not more than 20 cm. The smaller size improves the signal-to-noise ratio by minimizing the received sample noise. The actual loop sizes will be determined by trading off penetration for signal-to-noise ratio. Although square loops are shown, rectangular or circular loops may be substituted.

As in the case of the head coil, each focus coil loop contains a decoupling circuit so that DC bias applied to the loop prevents RF current from flowing upon the loop. Each focus coil loop is separately cabled to its own preamplifier and receiver channel (see FIG. 4). During the initial stages of a cardiac MRI examination, the physician can obtain an overview image using the half birdcage coil 70, thus visualizing the entire coronary system. During this portion of the exam, the birdcage is enabled by applying zero or reverse bias to the half birdcage decoupling circuit. The respective focus coil loops 62*a–c* are decoupled through the application of DC bias so that the half birdcage 70 operates as though the focus coil loops 62*a–c* were not present. During the latter half of the examination, the respective focus coil loops 62*a–c* are enabled and operate as a phased array coil since they are positioned with minimum mutual coupling. Alternatively, any of the small focus coil loops 62*a–c* may be operated individually while the remaining loops are decoupled.

Figure 4:
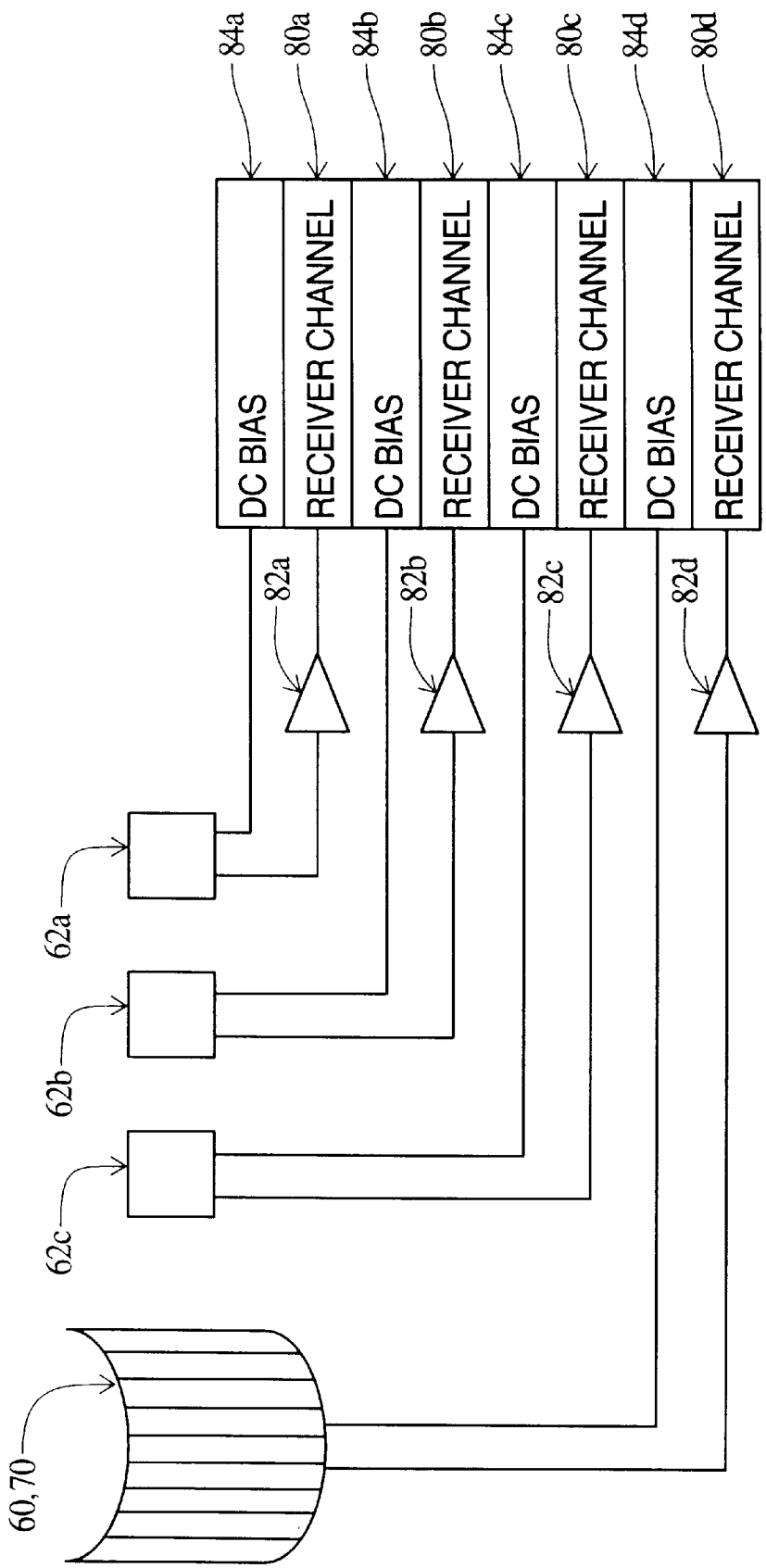

With reference to FIG. 4, a block diagram shows the wiring of the local radio frequency coil 34. Each of the volume coil 60 or 70 and the individual focus coils 62*a–c* is wired to its own receiver channel 80*a–d* via its own preamplifier 82*a–d*, and is wired to its own DC bias 84*a–d*.

In both embodiments, the small focus coil loops 62*a–c* are attached and co-located with a volume coil 60 or 70 so that both large area volume scans and high resolution focused scans may be performed without physically switching coils. While two specific preferred embodiments have been disclosed, numerous alternate embodiments are possible. The head birdcage coil may be replaced with any other type of volume coil, including saddle coils, solenoids, and dome-topped coils. The form of the head coil may be modified such that a more conformal fit to the head is achieved. The cardiac half birdcage may be replaced with a full birdcage (especially for pediatric cases), or by Helmholtz loops or saddle coils or arrays or either or both. The cardiac half birdcage can be driven in either a linear or quadrature mode. In either case, the plurality of small focus coil loops 62*a–c* may be positioned arbitrarily to correspond to particular regions of interest or may be overlapped to give minimum mutual inductance. The latter method allows several loops to be used simultaneously in a phased array. The small focus coil loops may be replaced by small Helmholz coils. These are particularly useful as focus coils at the top of the head, especially for use in conjunction with dome-shaped coils. The number of smaller focus coil loops may be increased or decreased. The maximum number of loops is limited by physical space available on the coil form and by the number of available receiver channels. The small focus coil loops may be constructed from normal metals (copper, aluminum, silver, etc.) or may be constructed from high-temperature superconductors (HTS). These HTS loops will require modifications in the mechanical design of the RF coil to support a cryostat but will have the advantage of increased signal-to-noise ratio over coils constructed from normal metals. Another alternative, as shown in FIG. 3, is to electrically connect the volume coil to the focus coils with a plurality of electronic components 72 to cancel coupling therebetween. For example, the electronic component 72 may be a capacitor, inductor, or varactor diode which counters coupling between the volume coil and the focus coils.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiment, the invention is now claimed to be:

1. A magnetic resonance imaging apparatus comprising:
   a main magnet for generating a main magnetic field in an examination region;
   a radio frequency coil assembly for transmitting radio frequency pulses into the examination region to induce magnetic resonance in selected dipoles disposed therein and for receiving signals from selected resonating dipoles disposed therein, the radio frequency coil assembly including:
   a birdcage coil having a plurality of conductive elements constructed on a dielectric form positioned about the examination region, the birdcage coil including a plurality of capacitors and corresponding plurality of diode inductor pairs connected with each capacitor to form resonant trap circuits such that when an electrical DC bias current is applied to the birdcage coil a parallel resonant circuit is formed at each capacitor which presents high impedance to electrical current flowing on endrings which effectively isolates adjacent conductive elements of the birdcage from one another; and,
   at least one focus coil having a conductive loop placed on a thin dielectric layer attached to the birdcage coil such that the focus coil is electrically insulated from the birdcage coil, the focus coil including a plurality of capacitors connected in series and a corresponding plurality of diode inductor pairs connected with each capacitor such that when an electrical DC bias current is applied to the focus coil a parallel resonance circuit is formed.

2. The magnetic resonance imaging apparatus of claim 1, wherein the number of conductive elements included in the birdcage coil is a multiple of four.

3. The magnetic resonance imaging apparatus of claim 1, wherein the birdcage coil has two RF output ports and two terminals such that the two RF output ports are connected to a quadrature combiner and the electrical DC bias current is applied between the two terminals.

4. The magnetic resonance imaging apparatus of claim 1, wherein the birdcage coil is a half-birdcage coil.

5. The magnetic resonance imaging apparatus of claim 1, having a plurality of focus coils wherein the conductive loops of each focus coil are overlapped to achieve minimum mutual inductance and the plurality of focus coils function collectively as a phased array.

6. The magnetic resonance imaging apparatus of claim 1, wherein each focus coil is connected to a dedicated electrical DC bias and a dedicated receiver channel.

7. The magnetic resonance imaging apparatus of claim 6, wherein an output of each focus coil is routed through an associated preamplifier to its dedicated receiver channel.

8. The magnetic resonance imaging apparatus of claim 1, wherein each focus coil is connected to the birdcage coil by at least one of a capacitor, an inductor, and a varactor diode.

9. A method of magnetic resonance imaging comprising:
   (a) generating a substantially uniform main magnetic field within an examination region;
   (b) applying magnetic gradients across the examination region;
   (c) arranging a radio frequency coil assembly relative to a subject within the examination region such that a volume coil is positioned for imaging a broad general field of view of the subject and a plurality of focus coils attached to the volume coil are positioned for imaging narrow specific regions of interest, said narrow specific regions of interest being located within the broad general field of view;
   (d) applying DC biasing currents to the radio frequency coil assembly for alternately engaging and disengaging the volume coil and focus coils;
   (e) selectively exciting magnetic resonance of dipoles within the examination region;
   (f) receiving signals from the resonating dipoles;
   (g) reconstructing an image representation from the received signals; and,
   (h) displaying the image representation on a human viewable display.

10. The method of claim 9, wherein:
    (c) further includes arranging the plurality of focus coils such that they overlap to minimize mutual inductance; and,
    (d) further includes engaging the plurality of focus coils such that they function collectively as a phased array.

11. In a magnetic resonance imaging apparatus having a main magnet which generates a substantially uniform main magnetic field within an examination region, a gradient coil assembly for generating substantially linear magnetic gradients across the examination region, a current supply for selectively supplying electrical current pulses to the gradient coil assembly, a radio frequency coil assembly disposed about the examination region positioned to transmit radio frequency signals into the subject receiving region and receive radio frequency signals therefrom, a transmitter for supplying radio frequency signals to the radio frequency coil assembly, a receiver for receiving radio frequency signals via the radio frequency coil assembly, and a reconstruction processor for reconstructing an image representation from the signals received by the radio frequency receiver to display on a human viewable display, the radio frequency coil assembly comprising:
    a volume coil for imaging a broad general field of view of a subject within the examination region; and,
    at least one focus coil, for imaging a specific narrow region of interest of the subject within the broad general field of view, attached to the volume coil such that it is electrically insulated therefrom, each focus coil having a conductive loop on a thin dielectric layer with a plurality of capacitors connected in series spaced along the conductive loop and a plurality of diode inductor pairs connected with each capacitor.

12. The radio frequency coil assembly of claim 11, wherein the volume coil is selected from the group consisting of birdcage coils, half-birdcage coils, saddle coils, solenoids, and dome-topped coils.

13. The radio frequency coil assembly of claim 11, wherein the radio frequency coil assembly includes a plurality of focus coils.

14. The radio frequency coil assembly of claim 13, wherein each focus coil is connected to the volume coil by at least one of a capacitor, an inductor, and a varactor diode.

15. The radio frequency coil assembly of claim 14, wherein the conductive loops of each focus coil are overlapped to achieve minimum mutual inductance and function collectively as a phased array.

16. The radio frequency coil assembly of claim 11, wherein each focus coil is arranged on the volume coil such that when the volume coil is positioned relative to a subject being examined for imaging the broad general field view the focus coils are in alignment with the specific narrow regions of interest.

17. A radio frequency coil assembly for a magnetic resonance scanner comprising:

a volume coil for imaging a field of view of a subject within an examination region which field of view includes at least one smaller subregion of interest; and, at least one focus coil attached to the volume coil and electrically insulated therefrom, the focus coil having a conductive loop on a thin dielectric layer which is dimensioned and arranged for imaging the subregion of interest within the field of view.

18. The radio frequency coil assembly of claim 17, wherein one of a capacitor, an inductor, and a varactor diode connects each focus coil to the volume coil.

19. The radio frequency coil assembly of claim 17, wherein a plurality of DC biases are attached to the volume coil and each focus coil such that when appropriate biases are applied the volume coil and each focus coil is selectively engaged.

20. The radio frequency coil assembly of claim 17, further including:

a plurality of focus coils attached to the volume coil, arranged such that the conductive loops of each focus coil is overlapped to produce minimum mutual inductance therebetween.

* * * * *